United States Patent
Zhao et al.

(10) Patent No.: US 11,832,530 B2
(45) Date of Patent: Nov. 28, 2023

(54) MULTI-BIT MEMORY CELL, ANALOG-TO-DIGITAL CONVERTER, DEVICE AND METHOD

(71) Applicant: BEIHANG UNIVERSITY, Beijing (CN)

(72) Inventors: Weisheng Zhao, Beijing (CN); Zhaohao Wang, Beijing (CN); Kaihua Cao, Beijing (CN); Gefei Wang, Beijing (CN); Min Wang, Beijing (CN)

(73) Assignee: BEIHANG UNIVERSITY, Beijing (CN)

( * ) Notice: Subject to any disclaimer, the term of this patent is extended or adjusted under 35 U.S.C. 154(b) by 180 days.

(21) Appl. No.: 17/508,819

(22) Filed: Oct. 22, 2021

(65) Prior Publication Data
US 2022/0285610 A1    Sep. 8, 2022

(30) Foreign Application Priority Data
Mar. 8, 2021 (CN) .......................... 202110252229.4

(51) Int. Cl.
*G11C 11/16* (2006.01)
*H10N 52/00* (2023.01)
(Continued)

(52) U.S. Cl.
CPC .......... *H10N 52/00* (2023.02); *G11C 11/1675* (2013.01); *H10B 61/00* (2023.02); *H10N 52/80* (2023.02)

(58) Field of Classification Search
CPC ........ H10N 52/00; H10N 52/80; H10N 50/10; G11C 11/1675; G11C 11/18; G11C 11/5607; H10B 61/00
(Continued)

(56) References Cited

U.S. PATENT DOCUMENTS

| | | | |
|---|---|---|---|
| 2012/0081950 A1* | 4/2012 | Slaughter | G11C 11/1657 365/158 |
| 2013/0016551 A1* | 1/2013 | Lombard | G11C 11/1659 257/E43.002 |

(Continued)

FOREIGN PATENT DOCUMENTS

| | | |
|---|---|---|
| CN | 110391331 A | 10/2019 |
| CN | 111045954 A | 4/2020 |

(Continued)

OTHER PUBLICATIONS

Yang, Jinghua, Embedding Logic and Non-volatile Devices in CMOS Digital Circuits for Improving Energy Efficiency, 2018, Arizona State University, All pages. (Year: 2018).*

(Continued)

*Primary Examiner* — Michael T Tran
(74) *Attorney, Agent, or Firm* — Westbridge IP LLC

(57) ABSTRACT

The present disclosure provides a multi-bit memory cell, an analog-to-digital converter, a device and a method. The multi-bit memory cell comprises: a spin-orbit coupling layer and a plurality of magnetic tunnel junctions disposed on the spin-orbit coupling layer, the plurality of magnetic tunnel junctions comprising a plurality of first magnetic tunnel junctions; the plurality of first magnetic tunnel junctions are sequentially arranged along a length direction of the spin-orbit coupling layer, and critical currents of reversals of the magnetizations of free layers of the plurality of first magnetic tunnel junctions are progressively increased or decreased in sequence along the length direction. The present disclosure provides a multi-bit memory unit with simple manufacturing process and structure.

10 Claims, 2 Drawing Sheets

(51) Int. Cl.
*H10B 61/00* (2023.01)
*H10N 52/80* (2023.01)

(58) Field of Classification Search
USPC .................................................. 365/158, 173
See application file for complete search history.

(56) References Cited

U.S. PATENT DOCUMENTS

| | | | |
|---|---|---|---|
| 2017/0160248 A1* | 6/2017 | Roizin | G01N 27/74 |
| 2017/0179374 A1* | 6/2017 | Omine | H01F 10/32 |
| 2017/0186472 A1 | 6/2017 | Jan et al. | |
| 2019/0035449 A1* | 1/2019 | Saida | G06N 3/084 |
| 2019/0051815 A1* | 2/2019 | Kakinuma | H10N 50/10 |
| 2021/0078633 A1* | 3/2021 | Hudson | B62D 15/025 |

FOREIGN PATENT DOCUMENTS

| | | | | |
|---|---|---|---|---|
| CN | 111540395 A | | 8/2020 | |
| JP | 2020123414 A | * | 8/2020 | ............. G06F 7/383 |
| JP | 7278250 B2 | * | 5/2023 | ........... G11C 11/161 |
| WO | WO-2020166722 A1 | * | 8/2020 | ........... H01L 27/222 |

OTHER PUBLICATIONS

First Office Action issued in counterpart Chinese Patent Application No. 202110252229.4, dated May 6, 2022.
Liu et al., Effect of Shape Anisotropy on Magnetization Dynamics in Perpendicular Magnetic Tunnel Junctions, Micronanoelectronic Technology, vol. 52, No. 3, pp. 157-161, dated Mar. 15, 2015.
Zhang et al., 3D Ferrimagnetic Device for Multi-Bit Storage and Efficient In-Memory Computing, IEEE Electron Device Letters, vol. 42, No. 2, pp. 152-155, dated Dec. 31, 2020.

* cited by examiner

MULTI-BIT MEMORY CELL, ANALOG-TO-DIGITAL CONVERTER, DEVICE AND METHOD

CROSS-REFERENCE TO RELATED APPLICATIONS

This application claims priority to Chinese Application Number 202110252229.4, filed on Mar. 8, 2021, the subject matter of which is incorporated herein by reference.

TECHNICAL FIELD

The present disclosure relates to a technical field of electronic devices, and in particular to a multi-bit memory cell, an analog-to-digital converter, a device and a method.

BACKGROUND ART

With the continuous reduction of the semiconductor process size, the Moore's Law slows down, and the increase of leakage current and the interconnection delay become the bottlenecks of the traditional CMOS memory. The Magnetic Random-Access Memory (MRAM) is expected to be a universal memory due to the advantages of an unlimited number of times of erasing, a non-volatility, fast read and write speeds, a radiation resistance, etc., and it is an ideal device for constructing a next generation of non-volatile primary memory and buffer memory. The Magnetic Tunnel Junction (MTJ) is a basic memory cell of the magnetic random-access memory. The second-generation Spin-Transfer Torque MRAM (STT-MRAM) has the disadvantages such as a long incubation delay, read and write interferences, etc., which limit further development thereof. The Spin-Orbit Torque MRAM (SOT-MRAM) has attracted wide attentions from the industrial and academic worlds due to its advantages of a fast write speed, a separation of read and write paths and a low power consumption.

The SOT-based NAND-SPIN (flash-like spin memory) has been widely concerned. The NAND-SPIN provides a plurality of magnetic tunnel junctions on a same spin coupling layer. During data writing, the plurality of magnetic tunnel junctions share a same spin-orbit torque current. The NAND-SPIN can make full use of a three-terminal structure of a single SOT-MRAM to reduce an average number of transistors, and further realize a high-density integration. However, at present, the SOT-based NAND-SPIN usually sets the spin-orbit coupling layer with different cross-sectional areas to realize different current densities at the different cross-sectional areas, thereby writing different data. In addition, the existing NAND-SPIN usually adopts the magnetic tunnel junctions with perpendicular magnetic anisotropy, which requires an external magnetic field. Therefore, the existing NAND-SPIN manufacturing process is complex, and an external magnetic field needs to be considered, so the structure is complicated.

SUMMARY OF THE DISCLOSURE

An objective of the present disclosure is to provide a multi-bit memory cell with a simple manufacturing process and structure. Another objective of the present disclosure is to provide a data writing method of a multi-bit memory cell. Still another objective of the present disclosure is to provide an analog-to-digital converter. Still another objective of the present disclosure is to provide a magnetic random-access memory. Still another objective of the present disclosure is to provide a computer device.

In order to achieve the above objectives, in an aspect, the present disclosure discloses a multi-bit memory cell, comprising: a spin-orbit coupling layer and a plurality of magnetic tunnel junctions disposed on the spin-orbit coupling layer, the plurality of magnetic tunnel junctions comprising a plurality of first magnetic tunnel junctions;

the plurality of first magnetic tunnel junctions are sequentially arranged along a length direction of the spin-orbit coupling layer, and critical currents of reversals of the magnetizations of free layers of the plurality of first magnetic tunnel junctions are progressively increased or decreased in sequence along the length direction.

Preferably, an easy magnetization axis direction of the first magnetic tunnel junction forms a first angle with a current direction of spin-orbit torque current input to the spin-orbit coupling layer, and the first angles formed by the plurality of first magnetic tunnel junctions and the current direction are changed in sequence so that the critical currents of the reversals of the magnetizations of the free layers of the plurality of first magnetic tunnel junctions are progressively increased or decreased in sequence along the length direction.

Preferably, the first magnetic tunnel junction has shape anisotropy, with a dimension in the easy magnetization axis direction as a length dimension, and a dimension in a direction perpendicular to the easy magnetization axis direction as a width dimension, a ratio of the length dimension to the width dimension of the first magnetic tunnel junction is an aspect ratio, and the current direction is the length direction of the spin-orbit coupling layer;

when the first angle is within a first angle interval, the critical current of the reversal of the magnetization of the free layer of the corresponding first magnetic tunnel junction is decreased with the increase of the first angle; and when the first angle is within a second angle interval, the critical current of the reversal of the magnetization of the free layer of the corresponding first magnetic tunnel junction is increased with the increase of the first angle;

when the critical currents of the reversals of the magnetizations of the free layers of the plurality of first magnetic tunnel junctions are progressively increased in sequence along the length direction, the first angles are within the first angle interval and the aspect ratios of the plurality of first magnetic tunnel junctions are the same, the plurality of first angles are progressively decreased in sequence along the length direction;

when the critical currents of the reversals of the magnetizations of the free layers of the plurality of first magnetic tunnel junctions are progressively increased in sequence along the length direction, the first angles are within the second angle interval and the aspect ratios of the plurality of first magnetic tunnel junctions are the same, the plurality of first angles are progressively increased in sequence along the length direction;

when the critical currents of the reversals of the magnetizations of the free layers of the plurality of first magnetic tunnel junctions are progressively decreased in sequence along the length direction, the first angles are within the first angle interval and the aspect ratios of the plurality of first magnetic tunnel junctions are the same, the plurality of first angles are progressively increased in sequence along the length direction;

when the critical currents of the reversals of the magnetizations of the free layers of the plurality of first magnetic tunnel junctions are progressively decreased in sequence along the length direction, the first angles are within the second angle interval and the aspect ratios of the plurality of first magnetic tunnel junctions are the same, the plurality of first angles are progressively decreased in sequence along the length direction.

Preferably, when the critical currents of the reversals of the magnetizations of the free layers of the plurality of first magnetic tunnel junctions are progressively increased in sequence along the length direction, and the first angles formed by the plurality of first magnetic tunnel junctions and the length direction are the same, aspect ratios of the plurality of first magnetic tunnel junctions are progressively increased in sequence;

when the critical currents of the reversals of the magnetizations of the free layers of the plurality of first magnetic tunnel junctions are progressively decreased in sequence along the length direction, and the first angles formed by the plurality of first magnetic tunnel junctions and the length direction are the same, the aspect ratios of the plurality of first magnetic tunnel junctions are progressively decreased in sequence.

Preferably, at least two of the plurality of first magnetic tunnel junctions have a same first angle and different aspect ratios; and at least two of the plurality of first magnetic tunnel junctions have different first angles and a same aspect ratio;

when the first angles are within a first angle interval, aspect ratios of the plurality of first magnetic tunnel junctions are progressively decreased or increased in sequence along the length direction, and the first angles formed by the plurality of first magnetic tunnel junctions and the length direction are correspondingly progressively increased or decreased in sequence along the length direction;

when the first angles are within a second angle interval, aspect ratios of the plurality of first magnetic tunnel junctions are progressively decreased or increased in sequence along the length direction, and the first angles formed by the plurality of first magnetic tunnel junctions and the length direction are also correspondingly progressively increased or decreased in sequence along the length direction.

Preferably, the plurality of magnetic tunnel junctions further comprise a plurality of second magnetic tunnel junctions disposed symmetrically with respect to the plurality of first magnetic tunnel junctions and forming, together with the length direction, second angles which are complementary to the first angles formed by the corresponding first magnetic tunnel junctions and the length direction.

Preferably, each of the second magnetic tunnel junctions is disposed adjacent to a corresponding first magnetic tunnel junction.

Preferably, the multi-bit memory cell further comprises a control module and a read module;

the control module is configured to input spin-orbit torque current to the spin-orbit coupling layer of the multi-bit memory cell in response to a control signal;

the read module is configured to input a detection current to the magnetic tunnel junctions disposed on the spin-orbit coupling layer, determine a resistance state of a corresponding magnetic tunnel junction according to a change of the detection current, and obtain current data corresponding to a current density of the spin-orbit torque current according to the resistance state.

The present disclosure further discloses a data writing method of the multi-bit memory cell aforementioned, comprising at least one one-time data writing step including:

inputting spin-orbit torque current to a spin-orbit coupling layer, a current density of the spin-orbit torque current being greater than critical current of a reversal of a magnetization of a free layer of a magnetic tunnel junction disposed on the spin-orbit coupling layer for data to be written.

Preferably, when the data writing method comprises a plurality of one-time data writing steps, critical currents of reversals of magnetizations of free layers of a plurality of magnetic tunnel junctions disposed on the spin-orbit coupling layer are sequentially arranged in a descending order to form a current queue in which a current interval is formed between two adjacent critical currents;

the plurality of one-time data writing steps are performed sequentially, in which current densities of the spin-orbit torque currents are respectively taken from a plurality of current intervals which are greater than a maximum critical current and arranged in a descending order.

The present disclosure further discloses an analog-to-digital converter, comprising at least one multi-bit memory cell aforementioned.

The present disclosure further discloses a magnetic random-access memory, comprising a plurality of multi-bit memory cells aforementioned and arranged in an array.

The present disclosure further discloses a computer device, comprising a memory, a processor, and a computer program stored on the memory and operable on the processor, wherein the processor and/or the memory comprises the multi-bit memory cell aforementioned.

In the multi-bit memory cell according to the present disclosure, the plurality of magnetic tunnel junctions comprising the plurality of first magnetic tunnel junctions are disposed on the spin-orbit coupling layer, and the plurality of first magnetic tunnel junctions are sequentially arranged along the length direction of the spin-orbit coupling layer. By setting a shape and a size of the first magnetic tunnel junction, the critical currents of the reversals of the magnetizations of the free layers B1 of the plurality of first magnetic tunnel junctions sequentially arranged are progressively increased or decreased in sequence. Therefore, during data writing, the magnetizations of the free layers B1 of different numbers of magnetic tunnel junctions are reversed by inputting spin-orbit torque currents with different current densities to the spin-orbit coupling layer. Therefore, the present disclosure can realize different data writing effects by controlling the current densities of the spin-orbit torque currents input to the spin-orbit coupling layer, without needing to set a complex cross-sectional shape of the spin-orbit coupling layer, and the process is simple. In addition, the magnetic tunnel junction of the present disclosure adopts a magnetic tunnel junction with in-plane magnetic anisotropy, without needing to set an external magnetic field, and the structure is simple.

BRIEF DESCRIPTION OF THE DRAWINGS

In order to explain the technical solutions in the embodiments of the present disclosure or in the prior art more clearly, the drawings to be used in the description of the embodiments or the prior art will be briefly introduced below. Obviously, the drawings used in the following description only illustrate some embodiments of the present disclosure, and other drawings can be obtained from them by persons of ordinary skill in the art without paying a creative labor.

DETAILED DESCRIPTION OF THE PREFERRED EMBODIMENTS

The technical solutions in the embodiments of the present disclosure will be described clearly and completely with reference to the drawings in the embodiments of the present disclosure. Obviously, those described are merely part, rather than all, of the embodiments of the present disclosure. Based on the embodiments of the present disclosure, any other embodiment obtained by persons of ordinary skill in the art without paying a creative labor should fall within the protection scope of the present disclosure.

Figure 1:
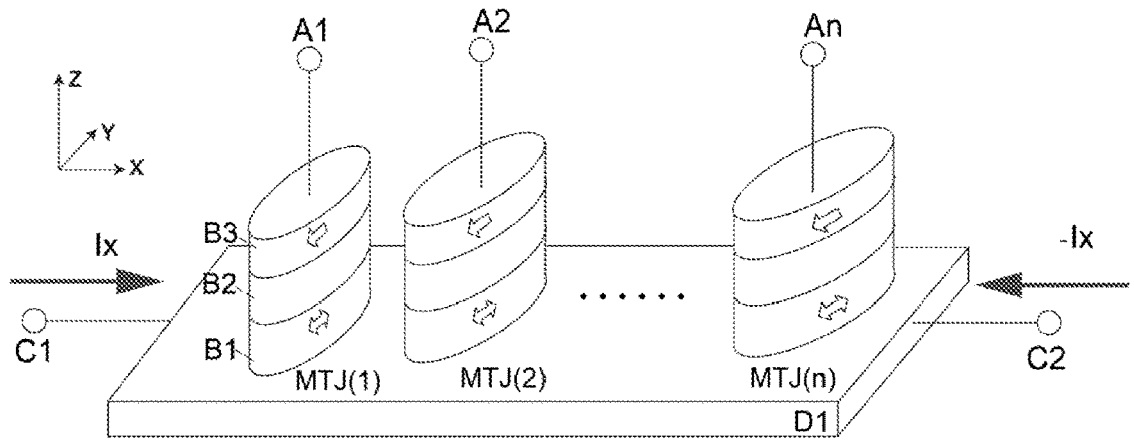
FIG. 1 illustrates a schematic diagram of a specific embodiment of a multi-bit memory cell according to the present disclosure.

According to an aspect of the present disclosure, an embodiment discloses a multi-bit memory cell. As illustrated in FIG. 1, in this embodiment, the multi-bit memory cell comprises a spin-orbit coupling layer, and a plurality of magnetic tunnel junctions disposed on the spin-orbit coupling layer and comprising a plurality of first magnetic tunnel junctions.

In which, the plurality of first magnetic tunnel junctions are sequentially arranged along a length direction of the spin-orbit coupling layer, and critical currents of reversals of magnetizations of free layers B1 of the plurality of first magnetic tunnel junctions are progressively increased or decreased in sequence along the length direction.

In the multi-bit memory cell according to the present disclosure, the plurality of magnetic tunnel junctions comprising the plurality of first magnetic tunnel junctions are disposed on the spin-orbit coupling layer, and the plurality of first magnetic tunnel junctions are sequentially arranged along the length direction of the spin-orbit coupling layer. By setting a shape and a size of the first magnetic tunnel junction, the critical currents of the reversals of the magnetizations of the free layers B1 of the plurality of first magnetic tunnel junctions sequentially arranged are progressively increased or decreased in sequence. Therefore, during data writing, the magnetizations of the free layers B1 of different numbers of magnetic tunnel junctions are reversed by inputting spin-orbit torque currents with different current densities to the spin-orbit coupling layer. Therefore, the present disclosure can realize different data writing effects by controlling the current densities of the spin-orbit torque currents input to the spin-orbit coupling layer, without needing to set a complex cross-sectional shape of the spin-orbit coupling layer, and the process is simple. In addition, the magnetic tunnel junction of the present disclosure adopts a magnetic tunnel junction with in-plane magnetic anisotropy, without needing to set an external magnetic field, and the structure is simple.

It should be noted that at least one of the plurality of magnetic tunnel junctions may comprise a fixed layer B3, a barrier layer B2, and the free layer B1 which are sequentially disposed from top to bottom. A bottom surface of the free layer B1 is fixedly connected with the spin-orbit coupling layer. It can be understood that a resistance of the magnetic tunnel junction depends on magnetization directions of the fixed layer B3 and the free layer B1, while those magnetization directions are determined by magnetization directions. In which, the magnetic tunnel junction is in a low-resistance state when the magnetization directions of the fixed layer B3 and the free layer B1 are the same, and is in a high-resistance state when the magnetization directions of the fixed layer B3 and the free layer B1 are opposite to each other. A current or voltage is input to the magnetic tunnel junction through a read circuit. According to a change of the current or the voltage, it can be determined whether the resistance state of the magnetic tunnel junction is a high-resistance state or a low-resistance state, and determined according to the resistance states of the two magnetic tunnel junctions, it can be determined whether the data stored in the cell is '1' or '0'. In which, the determination of the ranges of the high-resistance state and the low-resistance state is conventional technical means in the art, and those skilled in the art can determine the ranges of the resistance values of the high-resistance state and the low-resistance state of the magnetic tunnel junction according to the common knowledge, which will not be described here.

In a specific example, as shown in Table 1, the multi-bit memory cell comprises n first magnetic tunnel junctions (MTJ (1) to MTJ (n)), which are sequentially arranged along the length direction of the magnetic tunnel junctions, and the critical currents of the reversals of the magnetizations of the free layers B1 are progressively increased in sequence along the length direction, i.e., a critical current magnitude relation of the n first magnetic tunnel junctions is: MTJ (1)<MTJ (2)<MTJ (3) . . . <MTJ (n). Then, during data writing, data writing of part or all of the magnetic tunnel junctions can be realized by setting the current densities of the spin-orbit torque currents input to the spin-orbit coupling layer, and data writing of multi-bit specific data can be realized by inputting spin-orbit torque currents with different current densities to the spin-orbit coupling layer several times.

Specifically, when the current density of the spin-orbit torque current input to the spin-orbit coupling layer is greater than that of the critical current of MTJ (2) and less than that of the critical current of MTJ (3), the current density of the spin-orbit torque current does not reach that of the critical current of MTJ (3), so the input of the spin-orbit torque current can only reverse the magnetizations of the free layers B1 of MTJ (1) and MTJ (2), i.e., realizing data writing of MTJ (1) and MTJ (2).

For example, in Table 1, the magnetic tunnel junctions include the first magnetic tunnel junction among MTJ (1) to MTJ (n), wherein the critical currents of the reversals of the magnetizations of the free layers B1 of MTJ (1) to MTJ (n) are progressively increased in sequence. Thus, a spin-orbit torque current (initialization current) greater than the critical current of MTJ (n) may be input to the spin-orbit coupling layer. By controlling a current direction of the input spin-orbit torque current, the magnetizations of the free layers B1 of the magnetic tunnel junctions MTJ (1) to MTJ (n) are definitely reversed, and the resistance states of the magnetic tunnel junctions after the reversals of the magnetizations of the free layers B1 are corresponding to the logic number '0'. Thus, the number '0' is written into MTJ (1) to MTJ (n).

TABLE 1

|  | MTJ1 | MTJ2 | ... | MTJ (n – 1) | MTJ (n) |
| --- | --- | --- | --- | --- | --- |
| Initialization current | 0 | 0 | 0 | 0 | 0 |
| Current 1 | 1 | 0 | 0 | 0 | 0 |
| Current 2 | 1 | 1 | 0 | 0 | 0 |
| Current i | 1 | 1 | The first i MTJs are 1, and the remaining n – i MTJs are 0 | 0 | 0 |
| Current n – 1 | 1 | 1 | 1 | 1 | 0 |
| Current n | 1 | 1 | 1 | 1 | 1 |

As for the spin-orbit torque current i (i=1, 2, 3, . . . , n–1) input to the spin-orbit coupling layer, when the current density of the current i is greater than that of the critical current of MTJ (i) and less than that of the critical current of MTJ (i+1), the magnetizations of the free layers B1 of MTJ (1) to MTJ (i) can be definitely reversed, while the magnetizations of the free layers B1 of other MTJs will not be reversed. Similarly, by setting the current directions of the spin-orbit torque currents, the resistance states of MTJ (1) to MTJ (i) after the reversals of the magnetizations of the free layers B1 can be corresponding to the logic number '1', so that the number '1' can be written into MTJ (1) to MTJ (i). As for the current n, the magnetizations of the free layers B1 of all of the MTJs can be reversed just by causing the current density of the current n to be greater than that of the critical current of MTJ (n) which is a maximum critical current. Similarly, by setting the current directions of the spin-orbit torque currents, the resistance states of MTJ (1) to MTJ (n) after the reversals of the magnetizations of the free layers B1 can be corresponding to the logic number '1', so that the number '1' can be written into MTJ (1) to MTJ (i).

Further, in order to write a plurality of bits of data, spin-orbit torque currents with different current densities may be input to the spin-orbit coupling layer many times. Specifically, as for the plurality of first magnetic tunnel junctions in Table 1, when n bits of data need to be written, firstly a spin-orbit torque current with a current density greater than that of the critical current of MTJ (n) may be input to the spin-orbit coupling layer, so that the magnetizations of the free layers B1 of all of n magnetic tunnel junctions are definitely reversed, thereby realizing the data writing of the n magnetic tunnel junctions. Then, a spin-orbit torque current with a current density greater than that of the critical current of MTJ (n–1) and less than that of the critical current of MTJ (n) is input to the spin-orbit coupling layer, so that the magnetizations of the free layers B1 of n–1 magnetic tunnel junctions MTJ (1) to MTJ (n–1) with critical currents less than that of MTJ (n) can be reversed, thereby realizing the data writing of MTJ (1) to MTJ (n) without affecting the data having been written into MTJ (n). To sum up, the critical currents of the n magnetic tunnel junctions are sequentially arranged in a descending order to obtain a current queue, in which a current interval is formed by two adjacent critical currents. After the spin-orbit torque currents greater than the maximum critical current and within all of the current intervals in a descending order are sequentially input to the spin-orbit coupling layer, the writing of n bits of data of the n magnetic tunnel junctions can be realized. For instance, in a specific example, the spin-orbit coupling layer is provided with four first magnetic tunnel junctions MTJ (MTJ1 to MTJ4), and the current densities of the critical currents of MTJ1 to MTJ4 are increased in sequence. The length direction of the spin-orbit coupling layer comprises a positive x (+x) direction and a negative x (–x) direction. When the spin-orbit torque current is input along the positive x direction, the resistance state of the first magnetic tunnel junction after the reversal of the magnetization of the free layer B1 is corresponding to the logic number '1'; on the contrary, when the spin-orbit torque current is input in the negative x direction, the resistance state of the first magnetic tunnel junction is corresponding to the logic number '0'. When 0101 needs to be written, a first step is to introduce +x current, which should be greater than the critical current of MTJ4, and then +1111 is written into MTJ1 to MTJ4; a second step is to introduce –x current, which should be greater than the critical current of MTJ3 but less than the critical current of MTJ4, and then 0001 is written into MTJ1 to MTJ4; a third step is to introduce +x current, which should be greater than the critical current of MTJ2 but less than the critical current of MTJ3, and then +1101 is written into MTJ0 to MTJ4; and a fourth step is to introduce –x current, which should be greater than the critical current of MTJ1 but less than the critical current of MTJ2, and then 0101 is written into MTJ0 to MTJ4.

In a preferred embodiment, an easy magnetization axis direction of the first magnetic tunnel junction forms a first angle with a current direction of spin-orbit torque current input to the spin-orbit coupling layer, and the first angles formed by the plurality of first magnetic tunnel junctions and the current direction are changed in sequence so that the critical currents of the reversals of the magnetizations of the free layers B1 of the plurality of first magnetic tunnel junctions are progressively increased or decreased in sequence along the length direction. In which, when the input direction of the spin-orbit torque current is the length direction of the spin-orbit coupling layer, the first angle formed by the easy magnetization axis of the first magnetic tunnel junction and the current direction may refer to an acute angle formed by any of the first magnetic tunnel junctions and the +x direction or the –x direction of the length direction. When the spin-orbit torque current is input along a +y direction and a –y direction of a width direction of the spin-orbit coupling layer, the first angle may refer to an acute angle formed by the easy magnetization axes of any of the first magnetic tunnel junctions and the +y direction or the –y direction.

It can be understood that a magnetic tunnel junction with shape anisotropy, such as an elliptical magnetic tunnel junction, has an easy magnetization axis. When a spin-orbit torque current greater than the critical current corresponding to the magnetic tunnel junction is input to the spin-orbit coupling layer along the length direction thereof, the magnetization direction of the free layer B1 of the magnetic tunnel junction will be stably in the easy magnetization axis direction after being reversed. In addition, the current density required for the reversal of the magnetization of the free layer B1 varies with the angle between the easy magnetization axis direction and the current direction of the input spin-orbit torque current. Therefore, the first angles formed by the plurality of first magnetic tunnel junctions and the length direction may be changed in sequence, so that the critical currents of the reversals of the magnetizations of the free layers B1 of the plurality of first magnetic tunnel junctions are progressively increased or decreased in sequence along the length direction. In a preferred embodiment, the magnetic tunnel junction may also adopt a shape such as a rhombus, a rectangle, a triangle, an inclined semicircle or an isosceles triangle, so as not to have an axial symmetrical shape in the length direction and the width direction of the spin-orbit coupling layer.

Figure 2:
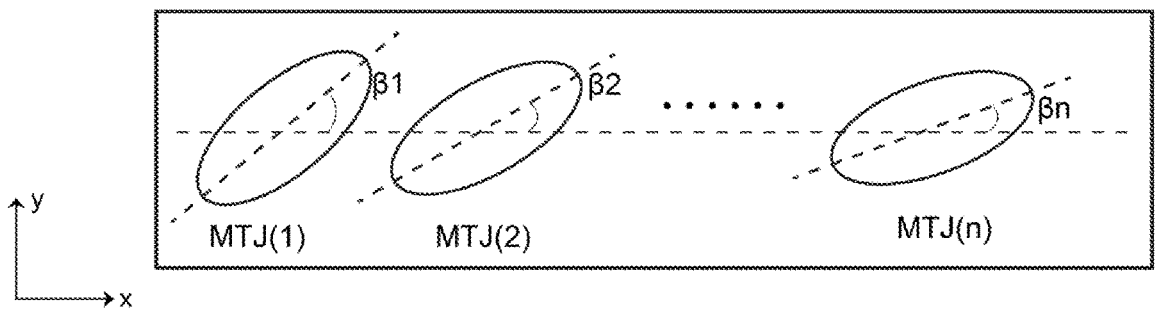
FIG. 2 illustrates a schematic diagram of settings of changes of first angles of a plurality of elliptical first magnetic tunnel junctions in a specific embodiment of a multi-bit memory cell according to the present disclosure.

In a specific example, as illustrated in FIG. 2, the first magnetic tunnel junction is shaped as elliptical. The easy magnetization axis of the elliptical first magnetic tunnel junction is an ellipse long axis. Therefore, the elliptical first magnetic tunnel junction is disposed obliquely, so that the elliptical long axis forms a first angle with the length direction of the spin-orbit coupling layer, and the purpose of sequentially changing the critical currents corresponding to a plurality of first magnetic tunnel junctions can be achieved by controlling the first angles of the sequentially arranged first magnetic tunnel junctions to be progressively increased or decreased in sequence. In this specific example, first angles (β1 to βn), which are progressively decreased along the length direction, are respectively formed by n first magnetic tunnel junctions MTJ (1) to MTJ (n) and the length direction of the spin-orbit coupling layer, then the critical currents corresponding to MTJ (1) to MTJ (n) are changed in sequence along the length direction.

In a preferred embodiment, the first magnetic tunnel junction has shape anisotropy, with a dimension in the easy magnetization axis direction as a length dimension, and a dimension in a direction perpendicular to the easy magnetization axis direction as a width dimension, and a ratio of the length dimension to the width dimension of the first magnetic tunnel junction is an aspect ratio;

when the first angle is within a first angle interval, the critical current of the reversal of the magnetization of the free layer B1 of the corresponding first magnetic tunnel junction is decreased with the increase of the first angle; and when the first angle is within a second angle interval, the critical current of the reversal of the magnetization of the free layer B1 of the corresponding first magnetic tunnel junction is increased with the increase of the first angle;

when the critical currents of the reversals of the magnetizations of the free layers B1 of the plurality of first magnetic tunnel junctions are progressively increased in sequence along the length direction, the first angles are within the first angle interval and the aspect ratios of the plurality of first magnetic tunnel junctions are the same, the aspect ratios of the plurality of first angles are progressively decreased in sequence along the length direction;

when the critical currents of the reversals of the magnetizations of the free layers B1 of the plurality of first magnetic tunnel junctions are progressively increased in sequence along the length direction, the first angles are within the second angle interval and the aspect ratios of the plurality of first magnetic tunnel junctions are the same, the aspect ratios of the plurality of first angles are progressively increased in sequence along the length direction;

when the critical currents of the reversals of the magnetizations of the free layers B1 of the plurality of first magnetic tunnel junctions are progressively decreased in sequence along the length direction, the first angles are within the first angle interval and the aspect ratios of the plurality of first magnetic tunnel junctions are the same, the aspect ratios of the plurality of first angles are progressively increased in sequence along the length direction;

when the critical currents of the reversals of the magnetizations of the free layers B1 of the plurality of first magnetic tunnel junctions are progressively decreased in sequence along the length direction, the first angles are within the second angle interval and the aspect ratios of the plurality of first magnetic tunnel junctions are the same, the aspect ratios of the plurality of first angles are progressively decreased in sequence along the length direction.

It can be understood that the first magnetic tunnel junction with shape anisotropy has in-plane magnetic anisotropy in a horizontal plane due to the imperfect symmetry of shape. Therefore, the critical current of the reversal of the magnetization of the free layer B1 of the first magnetic tunnel junction varies with the aspect ratio of the first magnetic tunnel junction. In this preferred embodiment, it is verified by experiments that the first angle has two angle intervals, in which the critical current of the first magnetic tunnel junction varies differently with the increase of the first angle. Specifically, when the first angle is within the first angle interval, corresponding critical current of the reversal of the magnetization of the free layer B1 of the first magnetic tunnel junction is decreased with the increase of the first angle; and when the first angle is within the second angle interval, corresponding critical current of the reversal of the magnetization of the free layer B1 of the first magnetic tunnel junction is increased with the increase of the first angle. In a specific example, the first magnetic tunnel is elliptical, the first angle interval is 20° to 70°, and the second angle interval is 70° to 90°. It should be noted that, in practical applications, the specific angle ranges of the first and second angle intervals will change due to the influences of the molding processes and materials of the spin-orbit coupling layer and the magnetic tunnel junction. In practical applications, those skilled in the art can measure the actual angle ranges of the first and second angle intervals through experiments. The above angle ranges are only specific examples of the first and second angle intervals, rather than limitations thereto.

Therefore, in order to realize that the critical currents of the reversals of the magnetizations of the free layers B1 of the plurality of first magnetic tunnel junctions are progressively increased or decreased in sequence along the length direction, the widths and the aspect ratios of the first magnetic tunnel junctions may be kept unchanged, while the first angles may be controlled to change, so that the critical currents corresponding to the plurality of first magnetic tunnel junctions are progressively increased or decreased in sequence.

Specifically, when the critical currents of the reversals of the magnetizations of the free layers B1 of the plurality of first magnetic tunnel junctions are progressively increased in sequence along the length direction, the first angles are within the first angle interval and the aspect ratios of the plurality of first magnetic tunnel junctions are the same, the plurality of first angles are progressively decreased in sequence along the length direction. That is, in the above specific example, as for the elliptical first magnetic tunnel junctions, when the first angle is between 20° and 70°, the critical current corresponding to the first magnetic tunnel junction is decreased with the increase of the first angle, so that the first angles of the plurality of first magnetic tunnel junctions arranged in sequence are progressively decreased in sequence along the length direction, and the critical currents corresponding to the plurality of first magnetic tunnel junctions are progressively increased in sequence along the length direction.

When the critical currents of the reversals of the magnetizations of the free layers B1 of the plurality of first magnetic tunnel junctions are progressively increased in sequence along the length direction, the first angles are within the second angle interval and the aspect ratios of the plurality of first magnetic tunnel junctions are the same, the plurality of first angles are progressively increased in sequence along the length direction. That is, in the above specific example, as for the elliptical first magnetic tunnel junctions, when the first angle is between 70° and 90°, the critical current corresponding to the first magnetic tunnel junction is increased with the increase of the first angle, so that the first angles of the plurality of first magnetic tunnel junctions arranged in sequence are progressively increased in sequence along the length direction, and the critical currents corresponding to the plurality of first magnetic tunnel junctions are progressively increased in sequence along the length direction.

When the critical currents of the reversals of the magnetizations of the free layers B1 of the plurality of first magnetic tunnel junctions are progressively decreased in sequence along the length direction, the first angles are within the first angle interval and the aspect ratios of the plurality of first magnetic tunnel junctions are the same, the plurality of first angles are progressively increased in sequence along the length direction. That is, in the above specific example, as for the elliptical first magnetic tunnel junctions, when the first angle is between 20° and 70°, the critical current corresponding to the first magnetic tunnel junction is decreased with the increase of the first angle, so that the first angles of the plurality of first magnetic tunnel junctions arranged in sequence are progressively increased in sequence along the length direction, and the critical currents corresponding to the plurality of first magnetic tunnel junctions are progressively decreased in sequence along the length direction.

When the critical currents of the reversals of the magnetizations of the free layers B1 of the plurality of first magnetic tunnel junctions are progressively decreased in sequence along the length direction, the first angles are within the second angle interval and the aspect ratios of the plurality of first magnetic tunnel junctions are the same, the plurality of first angles are progressively decreased in sequence along the length direction. That is, in the above specific example, as for the elliptical first magnetic tunnel junctions, when the first angle is between 70° and 90°, the critical current corresponding to the first magnetic tunnel junction is increased with the increase of the first angle, so that the first angles of the plurality of first magnetic tunnel junctions arranged in sequence are progressively decreased in sequence along the length direction, and the critical currents corresponding to the plurality of first magnetic tunnel junctions are progressively decreased in sequence along the length direction.

In a preferred embodiment, when the critical currents of the reversals of the magnetizations of the free layers B1 of the plurality of first magnetic tunnel junctions are progressively increased in sequence along the length direction, and the first angles formed by the plurality of first magnetic tunnel junctions and the length direction are the same, the aspect ratios of the plurality of first magnetic tunnel junctions are progressively increased in sequence. When the critical currents of the reversals of the magnetizations of the free layers B1 of the plurality of first magnetic tunnel junctions are progressively decreased in sequence along the length direction, and the first angles formed by the plurality of first magnetic tunnel junctions and the length direction are the same, the aspect ratios of the plurality of first magnetic tunnel junctions are progressively decreased in sequence.

Figure 3:
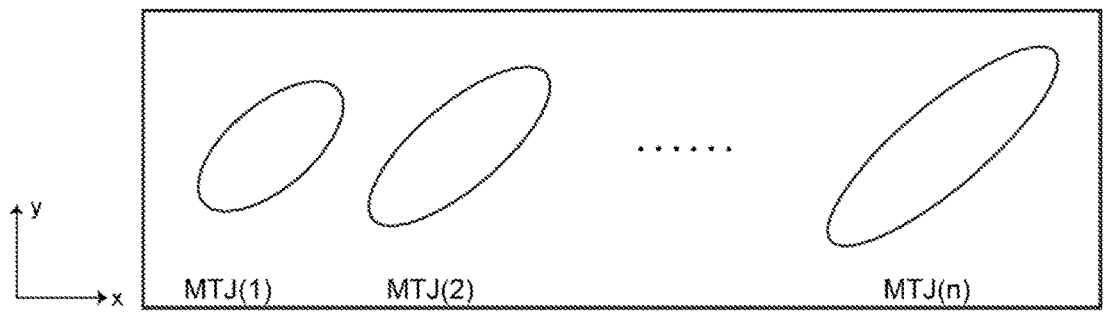
FIG. 3 illustrates a schematic diagram of settings of changes of aspect ratios of a plurality of elliptical first magnetic tunnel junctions in a specific embodiment of a multi-bit memory cell according to the present disclosure.

Specifically, it can be understood that the change of the aspect ratio of the magnetic tunnel junction with shape anisotropy will lead to a change of the critical current of the reversal of the magnetization of the free layer B1. Generally, in a case where the width dimension of the magnetic tunnel junction is unchanged, the current density of the critical current corresponding to the magnetic tunnel junction is increased with the increase of the length dimension. Therefore, when the critical currents of reversals of the magnetizations of the free layers B1 of the plurality of first magnetic tunnel junctions are progressively increased in sequence along the length direction and the first angles formed by the plurality of first magnetic tunnel junctions and the length direction are the same, the aspect ratios of the plurality of first magnetic tunnel junctions are progressively increased in sequence, as illustrated in FIG. 3. For example, as for the elliptical first magnetic tunnel junctions, in a case where a short axis length (i.e., the width dimension) is unchanged, the critical current corresponding to the first magnetic tunnel junction is increased with the increase of a long axis length (i.e., the length dimension). When the first angles of the plurality of first magnetic tunnel junctions are the same, the aspect ratios of the plurality of first magnetic tunnel junctions arranged in sequence can be progressively increased in sequence, so that the critical currents corresponding to the plurality of first magnetic tunnel junctions can be progressively increased in sequence.

When the critical currents of the reversals of the magnetizations of the free layers B1 of the plurality of first magnetic tunnel junctions are progressively decreased in sequence along the length direction and the first angles formed by the plurality of first magnetic tunnel junctions and the length direction are the same, the aspect ratios of the plurality of first magnetic tunnel junctions are progressively decreased in sequence. For example, as for the elliptical first magnetic tunnel junctions, when the first angles of the plurality of first magnetic tunnel junctions are the same, the aspect ratios of the plurality of first magnetic tunnel junctions arranged in sequence can be progressively decreased in sequence, so that the critical currents corresponding to the plurality of first magnetic tunnel junctions can be progressively decreased in sequence.

Figure 4:
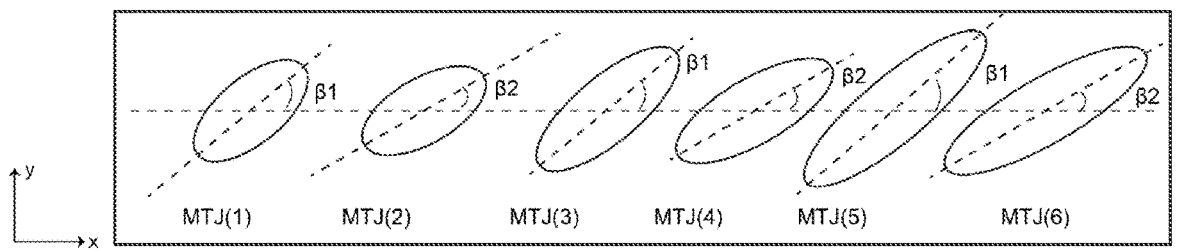
FIG. 4 illustrates a schematic diagram of settings of changes of both first angles and aspect ratios of a plurality of elliptical first magnetic tunnel junctions in a specific embodiment of a multi-bit memory cell according to the present disclosure.

In a preferred embodiment, as illustrated in FIG. 4, at least two of the plurality of first magnetic tunnel junctions have a same first angle and different aspect ratios. In addition, at least two of the plurality of first magnetic tunnel junctions have different first angles and a same aspect ratio. It can be understood that the critical currents corresponding to the plurality of first magnetic tunnel junctions can be progressively increased or decreased in sequence along the length direction of the spin-orbit coupling layer by controlling different changes of the first angles and the aspect ratios of the plurality of first magnetic tunnel junctions arranged in sequence. For example, in FIG. 4, the multi-bit memory cell comprises six first magnetic tunnel junctions MTJ (1) to MTJ (6), wherein the first angles of MTJ (1), MTJ (3) and MTJ (5) are the same and are $\beta 1$, and the first angles of MTJ (2), MTJ (4) and MTJ (6) are the same and are $\beta 2$. Meanwhile, the critical currents corresponding to MTJ (1) to MTJ (6) can be progressively increased or decreased in sequence based on the change of the aspect ratio of each of the first magnetic tunnel junctions. In practical applications, changes of the critical currents of the first magnetic tunnel junctions in sequence can be measured by experiments, so as to adjust the first angles or the aspect ratios of the first magnetic tunnel junctions, and achieve the inventive purpose of the present disclosure, which will not be described here.

In a preferred embodiment, when the first angles are within the first angle interval, the aspect ratios of the plurality of first magnetic tunnel junctions are progressively decreased or increased in sequence along the length direction, and the first angles formed by the plurality of first magnetic tunnel junctions and the length direction are correspondingly progressively increased or decreased in sequence along the length direction. When the first angles are within the second angle interval, the aspect ratios of the plurality of first magnetic tunnel junctions are progressively decreased or increased in sequence along the length direction, and the first angles formed by the plurality of first magnetic tunnel junctions and the length direction are also correspondingly progressively increased or decreased in sequence along the length direction.

It can be understood that in this preferred embodiment, by controlling the first angles and the aspect ratios of the plurality of first magnetic tunnel junctions arranged in sequence at the same time, critical currents corresponding to the plurality of first magnetic tunnel junctions have a same change trend when the first angles and the aspect ratios are changed, thereby obtaining a plurality of first magnetic tunnel junctions with critical currents progressively increased or decreased in sequence. Specifically, when the first angle is within the first angle interval, the first angle is inversely proportional to the critical current, while the aspect ratio of the first magnetic tunnel junction is directly proportional to the critical current. Therefore, it is necessary to cause the aspect ratios of the plurality of first magnetic tunnel junctions to be progressively decreased or increased in sequence, while the first angles to be changed inversely, i.e., to be progressively increased or decreased in sequence, thereby realizing sequential changes of the critical currents corresponding to the plurality of first magnetic tunnel junctions. Similarly, when the first angle is within the second angle interval, the second angle and the aspect ratio of the first magnetic tunnel junction are both directly proportional to the critical current. Therefore, it is necessary to cause the aspect ratios and the first angles of the plurality of first magnetic tunnel junctions to be progressively decreased or increased in sequence, thereby realizing sequential changes of the critical currents corresponding to the plurality of first magnetic tunnel junctions.

Figure 5:
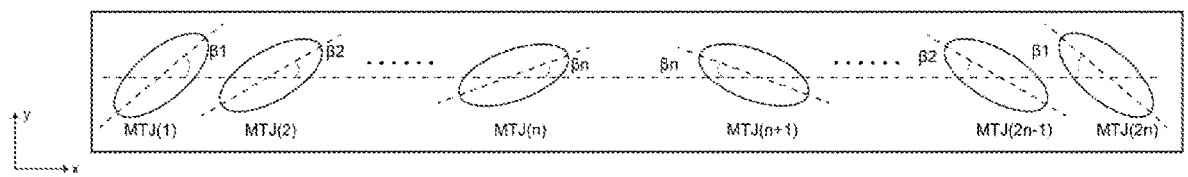
FIG. 5 illustrates a schematic diagram of a specific embodiment of a multi-bit memory cell according to the present disclosure, comprising a second magnetic tunnel junction.

In a preferred embodiment, as illustrated in FIG. 5, the plurality of magnetic tunnel junctions further comprise a plurality of second magnetic tunnel junctions disposed symmetrically with respect to the plurality of first magnetic tunnel junctions and forming together with the length direction, second angles which are complementary to the first angles formed by the corresponding first magnetic tunnel junctions and the length direction. Then, after the spin-orbit torque current is input to the spin-orbit coupling layer, the resistance states of each of the first magnetic tunnel junctions and the second magnetic tunnel junction disposed symmetrically with respect thereto are opposite to each other, and the complementary function can be realized. In which, a plurality of second magnetic tunnel junctions may be disposed on one side of the first magnetic tunnel junctions arranged in sequence, so that the plurality of first magnetic tunnel junctions and the plurality of second magnetic tunnel junctions are symmetrical as a whole, as illustrated in FIG. 5. More preferably, in order to reduce the influences of magnetic coupling, stray field, etc., each of the second magnetic tunnel junctions may be disposed adjacent to a corresponding first magnetic tunnel junction. For example, the first magnetic tunnel junctions and the second magnetic tunnel junctions may be disposed at intervals, so that each of the first magnetic tunnel junctions and the corresponding second magnetic tunnel junction are paired, and then a plurality of paired first magnetic tunnel junctions and second magnetic tunnel junctions are sequentially disposed on the spin-orbit coupling layer according to the magnitudes of the critical currents of all of the paired magnetic tunnel junctions.

It can be understood that in this preferred embodiment, the plurality of magnetic tunnel junctions further comprise a plurality of second magnetic tunnel junctions disposed symmetrically with respect to the plurality of first magnetic tunnel junctions. Then, when the spin-orbit torque current is input to the spin-orbit coupling layer along the length direction (the current direction is the length direction), the magnetization directions of the free layers B1 of each of the first magnetic tunnel junctions and the corresponding second magnetic tunnel junction disposed symmetrically with respect thereto are the same. When the magnetization directions of the fixed layers B3 of each of the first magnetic tunnel junctions and the corresponding second magnetic tunnel junction are opposite to each other, the resistance states of the first magnetic tunnel junction and the corresponding second magnetic tunnel junction are opposite to each other, that is, opposite logic numbers are written. For instance, in a specific example, the plurality of magnetic tunnel junctions comprise n first magnetic tunnel junctions MTJ (1) to MTJ (n) and n second magnetic tunnel junctions MTJ (n+1) to MTJ (2n) disposed symmetrically with respect to the n first magnetic tunnel junctions, i.e., totally 2n MTJ junctions. In which, the original i-th MTJ (i) is symmetrical with respect to MTJ (2n+1−i), and i=1, 2, 3, . . . , n. Then, when a certain current is introduced and causes the resistance states of five first magnetic tunnel junctions are corresponding to a logic number '01000', five symmetrical second magnetic tunnel junctions present a corresponding logic number '11101'. In which, the added second magnetic tunnel junctions may be used as complementary parts of the first magnetic tunnel junction, and MTJ (i) and MTJ (2n+1−i) constitute a complementary pair. By reading the resistance states of MTJ (i) and MTJ (2n+1−i) through a read circuit of a peripheral read module, the reading reliability can be effectively improved. It can be understood that when the spin-orbit torque current is input to the spin-orbit coupling layer along the width direction (the current direction is the width direction), the magnetization directions of the free layers B1 of each the first magnetic tunnel junctions and the corresponding second magnetic tunnel junction disposed symmetrically with respect thereto are opposite to each other. When the magnetization directions of the fixed layers B3 of each of the first magnetic tunnel junctions and the corresponding second magnetic tunnel junction are the same, the resistance states of the first magnetic tunnel junction and the corresponding second magnetic tunnel junction are opposite to each other, i.e., opposite logic numbers are written.

In a preferred embodiment, the length direction is or perpendicular to the input direction of the spin-orbit torque current of the spin-orbit coupling layer. It can be understood that in this embodiment, the length direction of the spin-orbit coupling layer is the input direction of the spin-orbit torque current, and in other embodiments, the spin-orbit torque current may also be input along the width direction of the spin-orbit coupling layer. At this time, the input direction of the spin-orbit torque current is perpendicular to the arrangement direction of the plurality of magnetic tunnel junctions. Being similar to the rule that the critical currents of the plurality of magnetic tunnel junctions are progressively increased or decreased when the spin-orbit torque current is input along the length direction of the spin-orbit coupling layer, the spin-orbit torque current input along the width direction of the spin-orbit coupling layer forms first angles with easy magnetization axes of the magnetic tunnel junctions, and the first angles may be changed to cause the critical currents of the reversals of the magnetizations of the free layers B1 of the plurality of first magnetic tunnel junctions to be progressively increased or decreased in sequence along the length direction. When the aspect ratios of the plurality of first magnetic tunnel junctions are changed to cause the critical currents of the reversals of the magnetizations of the free layers B1 of the plurality of first magnetic tunnel junctions to be progressively increased or decreased in sequence along the length direction, the spin-orbit torque current is input along the length direction and the width direction of the spin-orbit coupling layer, and the critical currents are progressively increased or decreased in the same rule.

In a preferred embodiment, the multi-bit memory unit further comprises a control module configured to input the spin-orbit torque current to the spin-orbit coupling layer of the multi-bit memory cell in response to a control signal. It can be understood that the control module can write bit data by inputting the spin-orbit torque current to the spin-orbit coupling layer of the multi-bit memory cell one or more times.

In a preferred embodiment, the multi-bit memory cell further comprises a read module configured to input a detection current to the magnetic tunnel junctions disposed on the spin-orbit coupling layer, determine a resistance state of a corresponding magnetic tunnel junction according to a change of the detection current, and obtain current data corresponding to a current density of the spin-orbit torque current according to the resistance state.

It can be understood that the detection current may be input to a plurality of magnetic tunnel junctions through the read module, and the resistance of each of the magnetic tunnel junctions may be determined according to the change of the detection current, thereby determining the data stored in each of the first magnetic tunnel junctions.

It should be noted that the control module and the read module may be realized by a circuit structure, and the specific design of the circuit structure is conventional technical means in the art. Those skilled in the art may adopt different circuit structures to realize the functions of the control module and the read module according to actual needs, which will not be described here.

Preferably, the spin-orbit coupling layer may be rectangular, so that a top surface area of the spin-orbit coupling layer is greater than the area occupied by the plurality of magnetic tunnel junctions disposed on the spin-orbit coupling layer, i.e., the plurality of magnetic tunnel junctions may be disposed on the spin-orbit coupling layer, and outer edges of the plurality of magnetic tunnel junctions may be positioned inside outer edges of the spin-orbit coupling layer. In which, the spin-orbit coupling layer preferably may be a heavy metal strip film, an antiferromagnetic strip film or a topological insulator strip film.

In a preferred embodiment, a top electrode may be disposed on a top of the magnetic tunnel junction, and an input electrode and an output electrode for the current are disposed on the opposite sides of the spin-orbit coupling layer respectively to input the detection current and the spin-orbit torque current. For example, the detection current in FIG. 1 may be input to the top electrode of the corresponding magnetic tunnel junction through terminals A1, A2 to An, and the spin-orbit torque current may be input to the electrodes at both ends of the spin-orbit coupling layer through terminals C1 and C2, respectively. In which, preferably, a material of the electrode may be any one of tantalum Ta, aluminum Al, gold Au or copper Cu.

Preferably, a material of the free layer B1 and the fixed layer B3 may be ferromagnetic metal, and a material of the barrier layer B2 may be oxide. The magnetic tunnel junction has in-plane magnetic anisotropy, which means that the magnetization directions of the free layer B1 and the fixed layer B3 forming the magnetic tunnel junction are along the in-plane direction. In which, the ferromagnetic metal may be a mixed metal material formed by at least one of cobalt-iron CoFe, cobalt-iron-boron CoFeB, nickel-iron NiFe, etc., and proportions of the mixed metal materials may be the same or different. The oxide may be one of oxides such as magnesium oxide MgO or aluminum oxide $Al_2O_3$ to produce a tunneling magnetoresistance effect. In practical applications, other feasible materials may also be used for the ferromagnetic metal and the oxide, which are not limited by the present disclosure.

The free layer B1 of the magnetic tunnel junction is fixed in contact with the spin-orbit coupling layer. The layers of the magnetic tunnel junction and the spin-orbit coupling layer may be sequentially plated on a substrate from bottom to top by a traditional method such as ion beam epitaxy, atomic layer deposition or magnetron sputtering, and then two or more magnetic tunnel junctions may be prepared and formed by a traditional nano-device processing process such as photolithography or etching.

In a preferred embodiment, the spin-orbit coupling layer may be made of a heavy metal film, an antiferromagnetic film, or a topological insulator film, etc., which may be shaped as rectangular, and a top area thereof is preferably larger than a bottom area of an outline formed by all of the magnetic tunnel junctions, so that two or more magnetic tunnel junctions can be disposed, and a bottom surface shape of the magnetic tunnel junction is completely embedded in a top surface shape of the heavy metal thin film, the antiferromagnetic thin film or the topological insulator thin film. Preferably, the material of the spin-orbit coupling layer may be selected from one of platinum Pt, Tantalum Ta, tungsten W, platinum manganese PtMn, iridium manganese IrMn, bismuth selenium compound BiSe, antimony tellurium compound SbTe, bismuth tellurium compound BiTe, etc. In practical applications, the spin-orbit coupling layer may also be formed of any other feasible material, which is not limited by the present disclosure. It should be noted that a sign of a spin Hall angle varies with a material of a lowest spin-orbit coupling layer, and a polarization direction of resulting spin current is also different. A metal with a negative spin Hall angle, such as W, is preferably used, and a metal such as Ta has a positive spin Hall angle. With different signs of the spin Hall angle, the spin-orbit torque currents to be applied to achieve the same effect of the reversal of the magnetization of the free layer B1 have opposite current directions.

In this embodiment, the magnetic tunnel junction comprises a fixed layer B3 on the top, a free layer B1 in contact with the spin-orbit coupling layer, and a barrier layer B2 disposed between the fixed layer B3 and the free layer B1.

The magnetic tunnel junction has a three-layer structure and only comprises one free layer B1. In other embodiments, there may be provided a plurality of free layers B1, i.e., two or more free layers B1. Thus, the magnetic tunnel junction comprises a fixed layer B3 on the top, a plurality of free layers B1 and a barrier layer B2 disposed between every two adjacent layers, and a lowest free layer B1 is disposed in contact with the spin-orbit coupling layer. For instance, in a specific example, when two free layers B1 are comprised, the magnetic memory cell structure may comprise a spin-orbit coupling layer, and a second free layer B1, a barrier layer B2, a first free layer B1, a barrier layer B2 and a fixed layer B3 which are sequentially disposed on the spin-orbit coupling layer.

In a preferred embodiment, the magnetic random-access memory cell further comprises a write module, which is configured to input the spin-orbit torque current I to the spin-orbit coupling layer 5, so that the magnetization directions of the free layers 4 of the first magnetic tunnel junction MTJ1 and the second magnetic tunnel junction MTJ2 change to the direction of the elliptical long axis, and then the resistance states of the first magnetic tunnel junction MTJ1 and the second magnetic tunnel junction MTJ2 are opposite to each other.

In the present disclosure, the plurality of magnetic tunnel junctions share a same spin-orbit coupling layer, and inclination angles of the magnetic tunnel junctions and/or the aspect ratios of the MTJ are different, so that the critical currents among different magnetic tunnel junctions are different. Therefore, the multi-bit memory cell of the present disclosure can be used to form an ADC. Data in all of the magnetic tunnel junctions is erased by initializing the current, and then some magnetic tunnel junctions are reversed according to the magnitude of the input current. The data in the magnetic tunnel junction is read by the read circuit as an input of a next stage of processing. During the storage of a plurality of bits, different data is stored in the MTJs in the NAND-SPIN through repeated writing with different critical currents. According to the present disclosure, a data conversion from analog signals to digital signals can be realized, a plurality of resistance states can be presented, and a plurality of bits of data can be stored, so that the present disclosure can be used in various devices such as ADCs, multi-resistance state devices, memories and the like, and has a wide applicability.

Based on the same principle, this embodiment further discloses a data writing method of the multi-bit memory cell according to this embodiment, comprising at least one one-time data writing step including:

S100: inputting spin-orbit torque current to a spin-orbit coupling layer, a current density of the spin-orbit torque current being greater than critical current of a reversal of a magnetization of a free layer B1 of a magnetic tunnel junction disposed on the spin-orbit coupling layer for data to be written.

In a preferred embodiment, when the data writing method comprises a plurality of one-time data writing steps, critical currents of reversals of magnetizations of free layers B1 of a plurality of magnetic tunnel junctions disposed on the spin-orbit coupling layer are sequentially arranged in a descending order to form a current queue in which a current interval is formed by two adjacent critical currents. The plurality of one-time data writing steps are performed sequentially, in which current densities of the spin-orbit torque currents are respectively taken from a plurality of current intervals which are greater than a maximum critical current and arranged in a descending order.

Specifically, in order to write a plurality of bits of data, spin-orbit torque currents with different current densities may be input to the spin-orbit coupling layer many times. Specifically, as for the plurality of first magnetic tunnel junctions in Table 1, when n bits of data needs to be written, firstly a spin-orbit torque current with a current density greater than that of the critical current of MTJ (n) (the maximum critical current) may be input to the spin-orbit coupling layer, so that the magnetizations of the free layers B1 of all of n magnetic tunnel junctions are definitely reversed, thereby realizing the data writing of the n magnetic tunnel junctions. Then, a spin-orbit torque current with a current density greater than that of the critical current of MTJ (n−1) and less than that of the critical current of MTJ (n) is input to the spin-orbit coupling layer, so that the magnetizations of the free layers B1 of n−1 magnetic tunnel junctions MTJ (1) to MTJ (n−1) with critical currents less than that of MTJ (n) can be reversed, thereby realizing the data writing of MTJ (1) to MTJ (n) without affecting the data having been written into MTJ (n). To sum up, the critical currents of the n magnetic tunnel junctions are sequentially arranged in a descending order to obtain a current queue in which a current interval is formed by two adjacent critical currents. That is, the plurality of current intervals are those formed by the critical currents of MTJ (j) to MTJ (j−1), wherein j=n, n−1, ..., 2. After the spin-orbit torque currents greater than the maximum critical current and within all of the current intervals in a descending order are sequentially input to the spin-orbit coupling layer, the writing of n bits of data of the n magnetic tunnel junctions can be realized. For instance, in a specific example, the spin-orbit coupling layer is provided with four first magnetic tunnel junctions MTJ (MTJ1 to MTJ4), and the current densities of the critical currents of MTJ1 to MTJ4 are increased in sequence. The length direction of the spin-orbit coupling layer comprises a positive x (+x) direction and a negative x (−x) direction. When the spin-orbit torque current is input along the positive x direction, the resistance state of the first magnetic tunnel junction after the reversal of the magnetization of the free layer B1 is corresponding to the logic number '1'; on the contrary, when the spin-orbit torque current is input in the negative x direction, the resistance state of the first magnetic tunnel junction is corresponding to the logic number '0'. When 0101 needs to be written, a first step is to introduce +x current, which should be greater than the critical current of MTJ4, and then +1111 is written into MTJ1 to MTJ4; a second step is to introduce −x current, which should be greater than the critical current of MTJ3 but less than the critical current of MTJ4, and then 0001 is written into MTJ1 to MTJ4; a third step is to introduce +x current, which should be greater than the critical current of MTJ2 but less than the critical current of MTJ3, and then +1101 is written into MTJ0 to MTJ4; and a fourth step is to introduce −x current, which should be greater than the critical current of MTJ1 but less than the critical current of MTJ2, and then 0101 is written into MTJ0 to MTJ4.

Since the principle for the data writing method to solve a problem is similar to that for the above magnetic random-access memory cell, the implementation of the data writing method can refer to the implementation of the above magnetic random-access memory cell, which will not be described here.

Based on the same principle, this embodiment further discloses an analog-to-digital converter, comprising at least one multi-bit memory cell as described in this embodiment. The present disclosure adopts a single device to converts different current inputs into a plurality of bits of data to realize a signal conversion, and the single device can be used to form an analog-to-digital converter.

Since the principle for the analog-to-digital converter to solve a problem is similar to that for the above magnetic random-access memory cell, the implementation of the analog-to-digital converter can refer to the implementation of the above magnetic random-access memory cell, which will not be described here.

Based on the same principle, this embodiment further discloses a magnetic random-access memory, comprising a plurality of the magnetic random-access memory cells according to this embodiment and arranged in an array.

The magnetic random-access memory, including permanent, non-permanent, removable and non-removable media, can store information by any method or technology. The information may be computer readable instructions, data structures, modules of programs, or other data. Examples of applications of the magnetic random-access memory include, but are not limited to, a Random-Access Memory (RAM), a Read-Only Memory (ROM), an Electrically Erasable Programmable Read-Only Memory (EEPROM), a flash memory or any other memory technology, a read-only Compact Disc Read-Only Memory (CD-ROM), a Digital Versatile Disc (DVD) or any other optical storage, a cassette magnetic tape, a magnetic tape disk storage or any other magnetic storage device or any other non-transmission medium, which can be configured to store information that can be accessed by a computing device.

Based on the same principle, this embodiment further discloses a computer device, comprising a memory, a processor and a computer program stored on the memory and operable on the processor.

The processor and/or the memory comprises the magnetic random-access memory cell according to this embodiment.

The magnetic random-access memory cell set forth in the above embodiments may be specifically disposed in a product device with a certain function. A typical implementation device is a computer device. Specifically, the computer device may be, for example, a personal computer, a laptop computer, a cellular phone, a camera phone, a smart phone, a personal digital assistant, a media player, a navigation device, an email device, a game console, a tablet computer, a wearable device or combinations thereof.

In a typical example, the computer device specifically comprises a memory, a processor and a computer program stored on the memory and operable on the processor. The processor and/or the memory comprises a magnetic random-access memory cell according to this embodiment.

Figure 6:
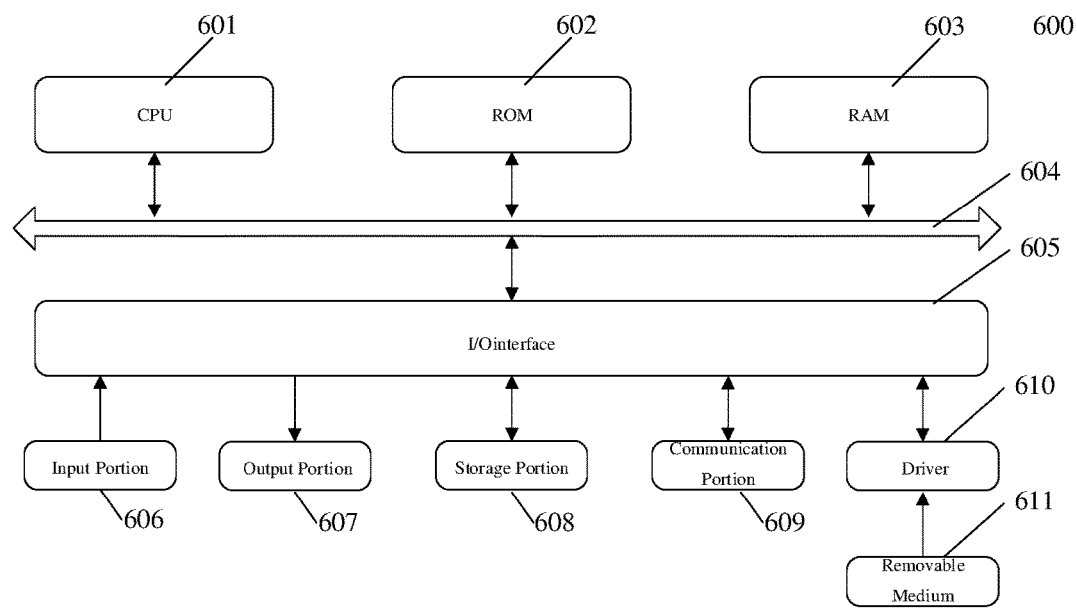
FIG. 6 illustrates a structural diagram of a computer device suitable for implementing an embodiment of the present disclosure.

Referring now to FIG. 6, which illustrates a structural diagram of a computer device 600 suitable for implementing an embodiment of the present disclosure.

As illustrated in FIG. 6, a computer device 600 comprises a central processing unit (CPU) 601, which can perform various appropriate works and processing according to a program stored in a Read-Only Memory (ROM) 602 or a program loaded from a storage portion 608 into a Random-Access Memory (RAM) 603. The RAM 603 further stores various programs and data required for operations of the system 600. The CPU 601, the ROM 602, and the RAM 603 are connected to each other through a bus 604. An input/output (I/O) interface 605 is also connected to the bus 604.

The following components are connected to the I/O interface 605: an input portion 606 comprising a keyboard, a mouse, etc.; an output portion 607 comprising a Cathode Ray Tube (CRT), a Liquid Crystal Display (LCD), a speaker, etc.; a storage portion 608 comprising a hard disk, etc.; and a communication portion 609 comprising a network interface card such as a LAN card, a modem, etc. The communication portion 609 performs communication processing via a network such as the Internet. A drive 610 is also connected to the I/O interface 605 as needed. A removable medium 611, such as a magnetic disk, an optical disk, a magneto-optical disk, a semiconductor memory, etc., is installed on the drive 610 as needed, so that a computer program read therefrom can be installed into the storage portion 608 as needed.

The present disclosure is described with reference to a flowchart and/or a block diagram of the method, device (system) and computer program product according to the embodiments of the present disclosure. It should be appreciated that each flow and/or block in the flowchart and/or the block diagram and a combination of flows and/or blocks in the flowchart and/or the block diagram can be implemented by computer program instructions. Those computer program instructions may be provided to a general computer, a dedicated computer, an embedded processor or a processor of other programmable data processing device to form a machine, so that the instructions, which are executed by the processor of the computer or other programmable data processing device, produce means for realizing the functions specified in one or more flows in the flowchart and/or one or more blocks in the block diagram.

These computer program instructions may also be stored in a computer readable memory capable of guiding the computer or other programmable data processing devices to work in a particular manner, so that the instructions stored in the computer readable memory can produce a product including instructing means for realizing the function(s) specified in one or more flows in the flowchart and/or one or more blocks in the block diagram.

These computer program instructions may also be loaded onto the computer or other programmable data processing devices, so that a series of operation steps can be performed in the computer or other programmable device to produce a processing realized by the computer, thus the instructions executed in the computer or other programmable devices provide the step(s) for realizing the function(s) specified in one or more flows in the flowchart and/or one or more blocks in the block diagram.

Further to be noted, the term 'comprise', 'include' or any other variant is intended to cover the non-exclusive inclusions, so that a process, a method, a commodity or a device comprising a series of elements comprise not only those elements, but also other elements not explicitly listed, or further comprise inherent elements of such process, method, commodity or device. In a case where there is no further limitation, the elements defined by a sentence 'comprising a . . . ' do not exclude other identical elements existing in the process, method, commodity or device comprising the elements.

Those skilled in the art should appreciate that the embodiments of the present disclosure may be provided as a method, a system, or a computer program product. Thus, the present disclosure may adopt the form of a complete hardware embodiment, a complete software embodiment, or a software and hardware combined embodiment. In addition, the present disclosure may adopt the form of a computer program product which is implementable in one or more computer readable storage mediums (including, but not limited to, a magnetic disk memory, a CD-ROM, an optical memory, etc.) containing computer readable program codes therein.

The present disclosure may be described in the general context of computer executable instructions executed by the computer, e.g., the program module. In general, the program module includes routine, program, object, component, data structure, etc. executing a particular task or realizing a particular abstract data type. The present disclosure may also be put into practice in distributed computing environments where tasks are executed by remote processing devices connected through a communication network. In the distributed computing environments, the program modules may be located in local and remote computer storage media including the storage device.

The embodiments herein are described in a progressive manner, and the same or similar parts of the embodiments can refer to each other. Each embodiment lays an emphasis on its distinctions from other embodiments. In particular, the system embodiment is simply described since it is substantially similar to the method embodiment, and please refer to the descriptions of the method embodiment for the relevant part.

Those described above are just specific embodiments of the present disclosure, and are not intended to limit the present disclosure. For those skilled in the art, various modifications and variations can be made to the present disclosure. Any modification, equivalent replacement, improvement, etc. made within the spirit and principle of the present disclosure should fall within the scope of the claims of the present disclosure.

What is claimed is:

1. A multi-bit memory cell, comprising: a spin-orbit coupling layer and a plurality of magnetic tunnel junctions disposed on the spin-orbit coupling layer, the plurality of magnetic tunnel junctions comprising a plurality of first magnetic tunnel junctions;
    the plurality of first magnetic tunnel junctions are sequentially arranged along a length direction of the spin-orbit coupling layer, and critical currents of reversals of the magnetizations of free layers of the plurality of first magnetic tunnel junctions are progressively increased or decreased in sequence along the length direction;
    an easy magnetization axis direction of the first magnetic tunnel junction forms a first angle with a current direction of spin-orbit torque current input to the spin-orbit coupling layer, and the first angles formed by the plurality of first magnetic tunnel junctions and the current direction are changed in sequence so that the critical currents of the reversals of the magnetizations of the free layers of the plurality of first magnetic tunnel junctions are progressively increased or decreased in sequence along the length direction.

2. The multi-bit memory cell according to claim 1, wherein the first magnetic tunnel junction has shape anisotropy, with a dimension in the easy magnetization axis direction as a length dimension, and a dimension in a direction perpendicular to the easy magnetization axis direction as a width dimension, a ratio of the length dimension to the width dimension of the first magnetic tunnel junction is an aspect ratio, and the current direction is the length direction of the spin-orbit coupling layer;
    when the first angle is within a first angle interval, the critical current of the reversal of the magnetization of the free layer of the corresponding first magnetic tunnel junction is decreased with the increase of the first angle; and when the first angle is within a second angle interval, the critical current of the reversal of the magnetization of the free layer of the corresponding first magnetic tunnel junction is increased with the increase of the first angle;
    when the critical currents of the reversals of the magnetizations of the free layers of the plurality of first magnetic tunnel junctions are progressively increased in sequence along the length direction, the first angles are within the first angle interval and the aspect ratios of the plurality of first magnetic tunnel junctions are the same, the plurality of first angles are progressively decreased in sequence along the length direction;
    when the critical currents of the reversals of the magnetizations of the free layers of the plurality of first magnetic tunnel junctions are progressively increased in sequence along the length direction, the first angles are within the second angle interval and the aspect ratios of the plurality of first magnetic tunnel junctions are the same, the plurality of first angles are progressively increased in sequence along the length direction;
    when the critical currents of the reversals of the magnetizations of the free layers of the plurality of first magnetic tunnel junctions are progressively decreased in sequence along the length direction, the first angles are within the first angle interval and the aspect ratios of the plurality of first magnetic tunnel junctions are the same, the plurality of first angles are progressively increased in sequence along the length direction;
    when the critical currents of the reversals of the magnetizations of the free layers of the plurality of first magnetic tunnel junctions are progressively decreased in sequence along the length direction, the first angles are within the second angle interval and the aspect ratios of the plurality of first magnetic tunnel junctions are the same, the plurality of first angles are progressively decreased in sequence along the length direction.

3. The multi-bit memory cell according to claim 1, wherein,
    when the critical currents of the reversals of the magnetizations of the free layers of the plurality of first magnetic tunnel junctions are progressively increased in sequence along the length direction, and the first angles formed by the plurality of first magnetic tunnel junctions and the length direction are the same, aspect ratios of the plurality of first magnetic tunnel junctions are progressively increased in sequence;
    when the critical currents of the reversals of the magnetizations of the free layers of the plurality of first magnetic tunnel junctions are progressively decreased in sequence along the length direction, and the first angles formed by the plurality of first magnetic tunnel junctions and the length direction are the same, the aspect ratios of the plurality of first magnetic tunnel junctions are progressively decreased in sequence.

4. The multi-bit memory cell according to claim 1, wherein at least two of the plurality of first magnetic tunnel junctions have a same first angle and different aspect ratios; and
    at least two of the plurality of first magnetic tunnel junctions have different first angles and a same aspect ratio;
    when the first angles are within a first angle interval, aspect ratios of the plurality of first magnetic tunnel junctions are progressively decreased or increased in sequence along the length direction, and the first angles formed by the plurality of first magnetic tunnel junctions and the length direction are correspondingly progressively increased or decreased in sequence along the length direction;
    when the first angles are within a second angle interval, aspect ratios of the plurality of first magnetic tunnel junctions are progressively decreased or increased in sequence along the length direction, and the first angles formed by the plurality of first magnetic tunnel junctions and the length direction are also correspondingly progressively increased or decreased in sequence along the length direction.

5. The multi-bit memory cell according to claim 1, wherein the plurality of magnetic tunnel junctions further comprise a plurality of second magnetic tunnel junctions disposed symmetrically with respect to the plurality of first magnetic tunnel junctions and forming, together with the length direction, second angles which are complementary to the first angles formed by the corresponding first magnetic tunnel junctions and the length direction.

6. The multi-bit memory cell according to claim 5, wherein each of the second magnetic tunnel junctions is disposed adjacent to a corresponding first magnetic tunnel junction.

7. The multi-bit memory cell according to claim 1, further comprising a control module and a read module; wherein
the control module is configured to input spin-orbit torque current to the spin-orbit coupling layer of the multi-bit memory cell in response to a control signal;
the read module is configured to input a detection current to the magnetic tunnel junctions disposed on the spin-orbit coupling layer, determine a resistance state of a corresponding magnetic tunnel junction according to a change of the detection current, and obtain current data corresponding to a current density of the spin-orbit torque current according to the resistance state.

8. A data writing method for the multi-bit memory cell according to claim 1, comprising at least one one-time data writing step including:
inputting spin-orbit torque current to a spin-orbit coupling layer, a current density of the spin-orbit torque current being greater than critical current of a reversal of a magnetization of a free layer of a magnetic tunnel junction disposed on the spin-orbit coupling layer for data to be written.

9. The data writing method according to claim 8, wherein when the data writing method comprises a plurality of one-time data writing steps, critical currents of reversals of magnetizations of free layers of a plurality of magnetic tunnel junctions disposed on the spin-orbit coupling layer are sequentially arranged in a descending order to form a current queue in which a current interval is formed between two adjacent critical currents;
the plurality of one-time data writing steps are performed sequentially, in which current densities of the spin-orbit torque currents are respectively taken from a plurality of current intervals which are greater than a maximum critical current and arranged in a descending order.

10. An analog-to-digital converter, comprising the multi-bit memory cell according to claim 1.

* * * * *